(12) United States Patent
French et al.

(10) Patent No.: US 7,466,390 B2
(45) Date of Patent: Dec. 16, 2008

(54) ACTIVE MATRIX DISPLAYS AND OTHER ELECTRONIC DEVICES HAVING PLASTIC SUBSTRATES

(75) Inventors: Ian D. French, Hove (GB); David J. McCulloch, Windsor (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 47 days.

(21) Appl. No.: 10/579,309

(22) PCT Filed: Nov. 17, 2004

(86) PCT No.: PCT/IB2004/052458

§ 371 (c)(1),
(2), (4) Date: May 16, 2006

(87) PCT Pub. No.: WO2005/050754

PCT Pub. Date: Jun. 2, 2005

(65) Prior Publication Data

US 2007/0091062 A1 Apr. 26, 2007

(30) Foreign Application Priority Data

Nov. 21, 2003 (GB) ................................ 0327093.1

(51) Int. Cl.
*G02F 1/1333* (2006.01)
*G02F 1/13* (2006.01)
(52) U.S. Cl. ...................................... 349/158; 349/187
(58) Field of Classification Search ................. 349/158, 349/187
See application file for complete search history.

(56) References Cited

U.S. PATENT DOCUMENTS

| 4,827,479 | A | * | 5/1989 | Campbell et al. ............... 372/5 |
| 5,686,360 | A | * | 11/1997 | Harvey et al. .................. 438/28 |
| 5,693,956 | A | * | 12/1997 | Shi et al. ....................... 257/40 |
| 5,757,126 | A | * | 5/1998 | Harvey et al. ............... 313/506 |
| 6,120,002 | A | * | 9/2000 | Biegelsen et al. ...... 251/129.01 |
| 6,168,948 | B1 | * | 1/2001 | Anderson et al. ........ 435/287.2 |
| 6,596,569 | B1 | | 7/2003 | Bao et al. |
| 6,857,501 | B1 | * | 2/2005 | Han et al. .................... 181/158 |
| 6,874,898 | B2 | * | 4/2005 | Akiyama ..................... 359/883 |
| 6,882,045 | B2 | * | 4/2005 | Massingill et al. .......... 257/724 |
| 7,172,897 | B2 | * | 2/2007 | Blackburn et al. ........ 435/287.2 |
| 2002/0022261 | A1 | * | 2/2002 | Anderson et al. ........ 435/287.2 |
| 2002/0024096 | A1 | | 2/2002 | Yamazaki et al. |

(Continued)

FOREIGN PATENT DOCUMENTS

EP 1046945 A2 10/2000

(Continued)

*Primary Examiner*—K. Cyrus Kianni
(74) *Attorney, Agent, or Firm*—Michael E. Belk

(57) ABSTRACT

A method of manufacturing an active matrix display device involves manufacturing a first substrate arrangement comprising a rigid glass substrate and an overlying plastic substrate. Pixel circuits are formed over the plastic substrate. The rigid glass substrate (12) is only removed from the plastic substrate after the mounting of the active and passive plates of the display into display modules (10). This method enables substantially conventional substrate handling, processing and cell making to be employed, for example in standard AMLCD factories, with only minimal extra equipment needed. A more general manufacturing method is also disclosed for fabricating TFTs on a spin-on plastic layer.

6 Claims, 7 Drawing Sheets

U.S. PATENT DOCUMENTS

| | | | |
|---|---|---|---|
| 2002/0124906 A1* | 9/2002 | Suzuki et al. | 141/98 |
| 2002/0150843 A1* | 10/2002 | Stewart | 430/323 |
| 2002/0155661 A1* | 10/2002 | Massingill et al. | 438/244 |
| 2002/0182766 A1 | 12/2002 | Yamamoto | |
| 2003/0068559 A1* | 4/2003 | Armstrong et al. | 429/234 |
| 2003/0141096 A1* | 7/2003 | Saccomanno | 174/100 |
| 2003/0162312 A1 | 8/2003 | Takayama et al. | |
| 2003/0223138 A1* | 12/2003 | Akiyama | 359/883 |
| 2004/0053290 A1* | 3/2004 | Terbrueggen et al. | 435/6 |
| 2004/0108588 A1* | 6/2004 | Gilleo | 257/704 |
| 2004/0144169 A1* | 7/2004 | Popielas et al. | 73/200 |
| 2004/0187451 A1* | 9/2004 | Suzuki et al. | 55/385.1 |
| 2005/0202504 A1* | 9/2005 | Anderson et al. | 435/6 |
| 2005/0253273 A1* | 11/2005 | Tai et al. | 257/774 |
| 2005/0271796 A1* | 12/2005 | Neudecker et al. | 427/58 |
| 2006/0105492 A1* | 5/2006 | Veres et al. | 438/99 |
| 2007/0091062 A1* | 4/2007 | French et al. | 345/107 |

FOREIGN PATENT DOCUMENTS

| | | |
|---|---|---|
| EP | 1122794 A2 | 8/2001 |
| JP | 60041018 A | 3/1985 |
| JP | 60087313 A | 5/1985 |
| JP | 2001290138 A | 10/2001 |
| JP | 2003318195 A | 11/2003 |

* cited by examiner

ACTIVE MATRIX DISPLAYS AND OTHER ELECTRONIC DEVICES HAVING PLASTIC SUBSTRATES

This invention relates to the manufacture of electronic devices, such as active matrix display devices, on plastic substrates and to the devices themselves.

The most common form of active matrix display is an active matrix liquid crystal display (AMLCD). AMLCD devices are usually made on large glass substrates that are 0.7 mm thick. Two plates are needed for a cell, so that completed displays are just over 1.4 mm thick. Mobile phone manufacturers, and some laptop computer manufacturers, require thinner and lighter displays, and completed cells can be thinned in an HF (hydrofluoric acid) solution, typically to about 0.8 mm thick. Mobile phone manufacturers ideally want the displays to be even thinner, but it has been found that cells below 0.8 mm thick made by this method are too fragile.

The HF thinning is not attractive because it is a wasteful process that uses hazardous chemicals that are difficult to dispose of safely and economically. There is also some yield loss during the etching process due to pitting of the glass.

The attractiveness of light, rugged and thin plastic AMLCDs as an alternative has long been recognised. Recently, interest in plastic displays has increased even further, partly due to the increased use of colour AMLCDs in mobile phones and PDAs. There has been much research recently into AMLCDs and organic light emitting diode (OLED) displays on plastic substrates. Despite this interest, there is still a need for a plausible manufacturing route for mass production of plastic displays.

Three main different ways have been reported for the manufacture of thin film transistors (TFTs) or displays on plastic substrates. These are making devices directly onto freestanding plastic substrates, transfer processes and sacrificial etching. Some examples of these techniques and the difficulties associated with them are discussed below.

(i) Making AMLCDs Directly Onto Plastic Substrates

This was the first approach to the fabrication of AMLCDs on plastic, and typically used low temperature polycrystalline silicon (LTPS) TFTs or amorphous silicon (a-Si) TFTs. There are many problems with this approach and it has not yet reached the manufacturing stage.

The processing temperature for TFT fabrication and cell making must be limited because plastic substrates shrink when they are heated, which makes photolithography alignment and plate coupling difficult. Preheating the substrate for many hours reduces the amount of shrinkage during processing, but does not totally eliminate it. Reduced process temperatures cause problems with the TFTs (less electrically stable a-Si TFTs, poor quality gate dielectric $SiO_2$ for LTPS TFTs).

Although several different attempts have been made by different parties for manufacturing displays on freestanding plastic substrates, the problem of substrate handling in automated factories has also not been resolved. It is impossible to use standard AMLCD factories, which rely on the mechanical strength of the glass substrates for handling, transport in cassettes and photoresist spinning. A completely new set of machines would need to be developed for every process step. It would also need a coordinated approach from many different machine manufacturers and if any one type of equipment manufacturer was not involved, or if they did not successfully develop a module, then all the work on other machines would be wasted.

Several groups have proposed roll-to-roll manufacturing, but this still has severe problems for use in vacuum equipment and for aligning layers. New printing techniques would need to be developed, and whether this could really be done for high yield processes and fine alignment is unsure.

Most freestanding plastic films have poor surface quality, in particular they tend not to be smooth and have lots of cracks on their surface. Glass substrates are mechanically hard, so that they are not scratched by gentle contacts, and they can be carried in cassettes. In these cassettes, only the edges of the glass touch the cassette, so that most of the area of the glass is never touched. In comparison, plastic substrates are soft and they are not rigid enough to be carried in cassettes. This means that they must be packed flat in contact with other layers, or they must be wound onto a roll, in which case both top and bottom surfaces will be in contact with other layers while under mechanical stress. These processes tend to damage the soft surface of the plastic. In standard AMLCD manufacturing, great care is taken to have as near perfect glass surfaces as possible, so scratched rough plastic surfaces are unlikely to be a realistic option for high yield mass production. Surfaces can be planarised and given additional protective coatings, but this adds process steps and hence cost.

(ii) Plastic Displays by Transfer Processes

A known example of this process is the so-called SUFTLA process developed by Seiko Epson Corporation This is a double transfer process. First, Low Temperature Polycrystalline Silicon (LTPS) TFT arrays are made on amorphous silicon and silicon dioxide layers on glass. The top of the TFT array is then stuck to a plastic substrate with water-soluble glue and the TFT layers are freed from the bottom substrate by using a XeCl laser to irradiate the bottom a-Si layer through the glass.

The laser beam causes hydrogen exodiffusion, and the released hydrogen lifts the TFT array from the original glass substrate. For practical reasons, the TFT array has a standard geometry, with the top of the LTPS TFT array towards the LC material of the AMLCD. A second plastic film is laminated to the bottom of the TFT array using a permanent adhesive. The array is then released from the first plastic film by dissolving the water-soluble adhesive.

This is an expensive process due to the use of two transfer processes, and is expected to have yield problems. There may also be problems in obtaining good flat displays by laminating the TFT layers to the plastic substrates. After the TFT array has been transferred to the final plastic substrate, then cell manufacture becomes an issue. This requires two thin flexible plastic sheets to be accurately aligned together, followed by the cell coupling and filling. Problems arise in mass production due to difficulties in substrate handling and alignment.

Another transfer process which has been proposed involves forming LTPS arrays on a layer of $SiO_2$ on glass substrates. Again, a second substrate is stuck onto the TFT array with water soluble glue, but this time the glass substrate is etched away in HF. The array is then transferred to a permanent plastic substrate and the temporary substrate removed by dissolving the water soluble glue. This differs from the transfer process described above in that the TFT array is transferred onto a temporary substrate by etching the glass substrate instead of using a laser transfer process. This process may have better yield, but it is expensive and environmentally wasteful due to the complete etching of the entire glass substrate.

One major advantage of these transfer techniques is that the TFTs are not made on the final plastic substrates so that high temperature processing can be used. Also, there are no problems with substrate shrinkage, which is one of the main problems of TFT fabrication on freestanding plastic substrates, as described above.

(ii) Plastic Displays by Sacrificial Etching

Another proposal has been the use of an a-Si sacrificial layer over a rigid substrate, with subsequent spinning on of a plastic layer. Poly-silicon TFTs are made on top of the plastic layer and etch holes are made through the plastic layer and the array. The substrate is then immersed in a liquid etch which passes through the etch holes and dissolves the a-Si sacrificial layer, allowing the plastic layer and TFTs to float off. This process is not suitable for making displays because of the etch holes that pepper the array.

According to a first aspect of the invention, there is provided a method of manufacturing an active matrix display device, comprising:

manufacturing a substrate arrangement comprising a rigid carrier substrate and a plastic substrate over the rigid carrier substrate;

forming an array of pixel circuits over the plastic substrate of the substrate arrangement;

forming a display layer over the array of pixel circuits; and releasing the rigid carrier substrate from the plastic substrate after forming the display layer.

The invention provides a method which enables substantially conventional substrate handling, processing and cell making to be employed.

This then enables the manufacturing process for making active matrix displays on plastic substrates to be carried out in standard factories, with only minimal extra equipment needed.

Forming the display layers over the array of pixel circuits may comprise providing a reflective electrophoretic display layer over the array of pixel circuits or forming LEDs (for example printing polymer LEDs) over the array of pixel circuits.

In one example, the method further comprises manufacturing a second substrate arrangement, and wherein forming display layers over the array of pixel circuits comprises mounting the first and second substrate arrangements with electro-optic material sandwiched therebetween, the active matrix display device thereby comprising first and second substrates with the electro-optic material sandwiched therebetween.

The plastic displays can be made on standard glass substrates, and these can be re-used many times. This invention can be applied for example for LCDs, PLED or OLED displays and electrophoretic displays, and with amorphous silicon (a-Si) or Low Temperature Polycrystalline silicon (LTPS) TFTs.

The process essentially allows the TFTs to be fabricated on plastic layers, interconnects to be made, and some packaging to be carried out while the plastic layer is still stuck to the glass. The release is carried out after the cell formation. This is attractive for all plastic substrate applications, and is a particularly attractive process for making displays on flexible substrates.

In one example, the plastic is capable of wet casting. The plastic layer can for example be applied to the rigid substrate by a spin-on process, and this plastic substrate then becomes the final display substrate. Alternatively, the plastic can be applied by spreading with a blade or printing techniques such as offset litho or silk screen printing.

In another example, the plastic is parylene, and the parylene deposition process is employed, which comprises depositing a parylene layer by polymerisation of a gas of monomer particles including a para-xylylene.

The invention enables as much of the processing, cell making and making interconnects as possible to be carried out while the plastic is still adhered to the glass. The release process is as late as possible. Cell making and making interconnect is notoriously difficult with thin flexible substrates and all manufacturing experience and expertise is geared for rigid glass substrates.

The rigid carrier preferably comprises a glass substrate.

If a release layer is used, it can comprise amorphous silicon, and the release can then be carried out by a laser release process.

Each pixel circuit preferably comprises at least a thin film transistor, for example an amorphous silicon TFT.

In the example using two substrates with electro-optic material sandwiched therebetween, manufacturing the second substrate arrangement may also comprise providing a second rigid carrier substrate, a second release layer and a second plastic substrate over the release layer.

The second rigid carrier can also comprise a glass substrate, and the second release layer can again comprise amorphous silicon.

The second substrate arrangement is essentially the passive plate of the display, and may (as is known) further comprise a black mask layer. Manufacturing the second substrate arrangement may also comprise forming an array of wells in an upper surface of the second substrate arrangement. These can be formed in a polymer layer provided over the second plastic substrate, and colour filters can be formed in the array of wells.

Inkjet printing can be used to form the colour filters.

Manufacturing the second substrate may further comprise providing a top conductive layer, for example ITO. This acts as a common electrode for the display pixels.

The second rigid carrier substrate is also released from the second plastic substrate after the mounting of the two substrate arrangements, and this may also be carried out using a laser process. A polarizer may then be added to the first and second plastic substrates.

Mounting the first and second substrate arrangements with the electro-optic material sandwiched therebetween may comprise performing vacuum aligned LC filling.

The invention can also be applied to the manufacture of other electronic devices.

Thus, according to a second aspect of the invention, there is provided a method of manufacturing a thin film electronic device, the method comprising:

applying a plastic coating to a rigid carrier substrate using a spin-on process, the plastic coating forming a plastic substrate;

forming thin film electronic elements over the plastic substrate; and releasing the rigid carrier substrate from the plastic substrate.

Furthermore, according to a third aspect of the invention, there is provided a method of manufacturing a thin film electronic device, the method comprising:

forming a parylene coating on a rigid carrie substrate, the parylene coating forming a plastic substrate;

forming thin film electronic elements over the plastic substrate; and releasing the rigid carrier substrate from the plastic substrate.

The invention can thus be applied to fields other than display manufacture, and again enables substantially conventional substrate handling to be used in the processing of a thin film electronic device on a plastic substrate. The use of a spin-on process or the parylene deposition process gives a flat, high quality surface. The ability to process using conventional handling equipment improves the yield. The thin film electronic elements preferably comprise think film transistors.

The invention also provides a thin film electronic device, comprising:

a parylene substrate; and thin film electronic elements disposed over the parylene substrate.

This device may be implemented as a number of different types of display devices.

Examples of the invention will now be described in detail with reference to the accompanying drawings, in which.

In a first aspect, the invention provides a manufacturing method in which the active plate of an active matrix display is carried on a plastic substrate which, during processing, is bonded to a glass substrate to facilitate handling and processing. Release of the plastic substrate is carried out after formation of the display cell.

Figure 1:
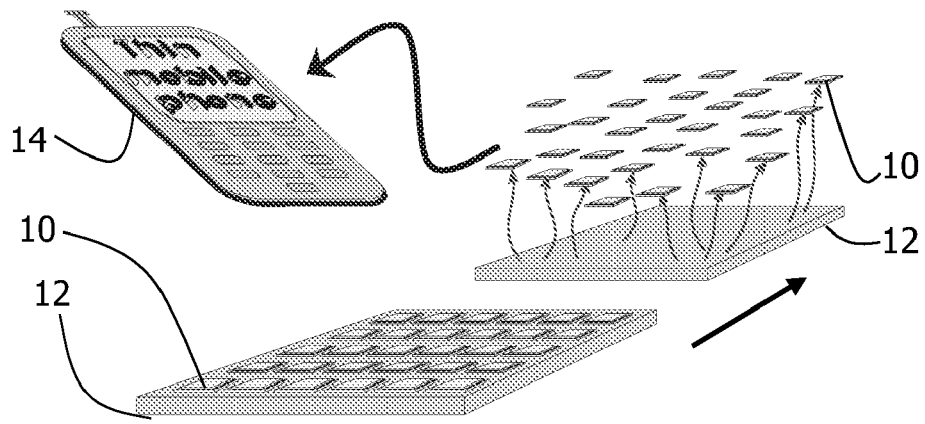
FIG. 1 shows manufactured displays made in accordance with the invention being released from a common glass substrate for use in a mobile phone.

FIG. 1 shows schematically the fabrication of plastic displays in accordance with the invention, and shows the final release stage. Completed displays 10 are released from a glass substrate 12 and are then used in devices such as a mobile phone 14.

One example of the method of the invention will now be described in detail, to show how a display can be made using laser release from a glass substrate, ink jet printing for colour filters of the display, and VALC (vacuum aligned LC) for cell making. The example shown in detail is for the manufacture of liquid crystal display cells, having LC material sandwiched between two opposite (active and passive) substrates. The invention can be applied to many other display technologies and to non-display technologies, and the specific example is for illustration only.

Figure 2A:
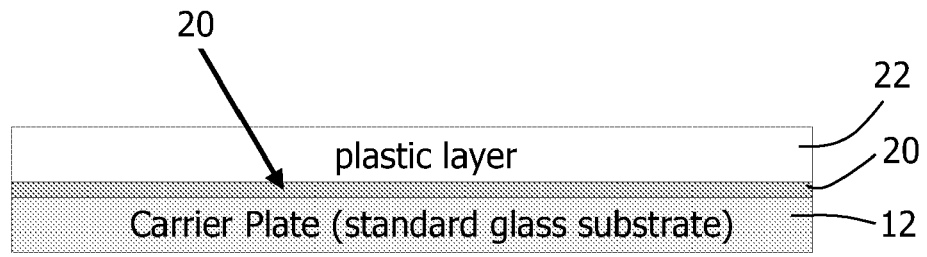
FIGS. 2A to 2N show the processing steps for one example of method of the invention.
Figure 2B:
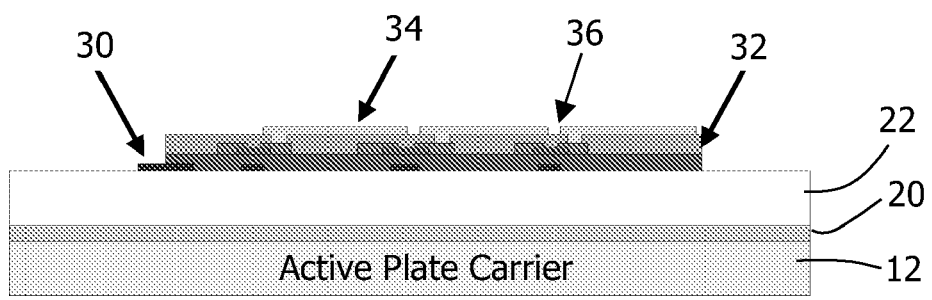
Figure 2C:
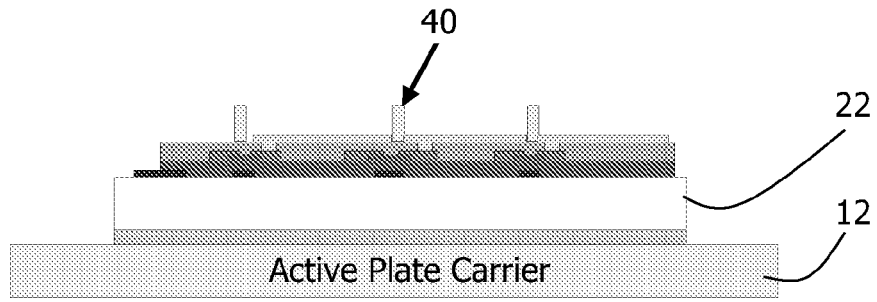
Figure 2D:
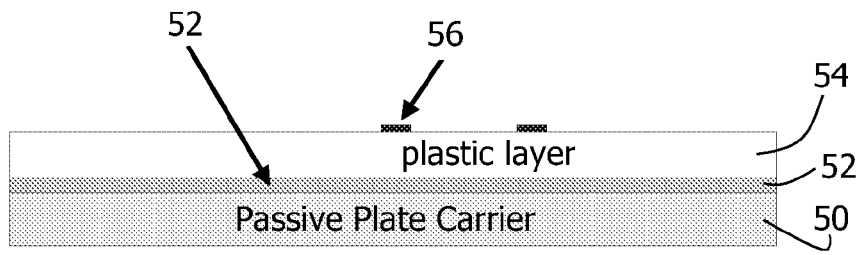
Figure 2E:
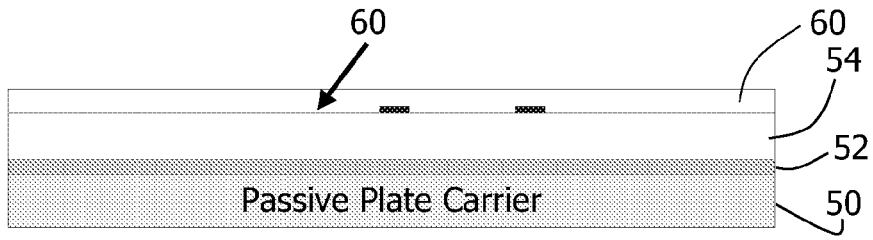
Figure 2F:
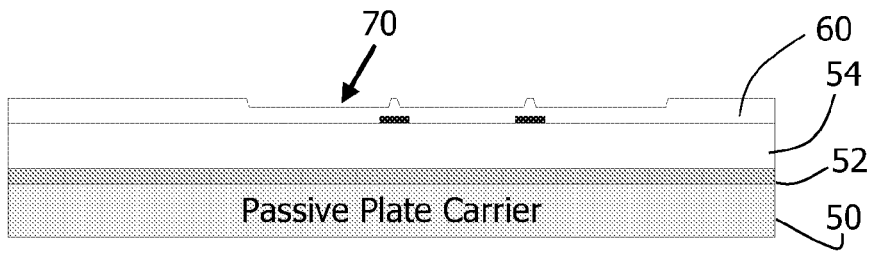
Figure 2G:
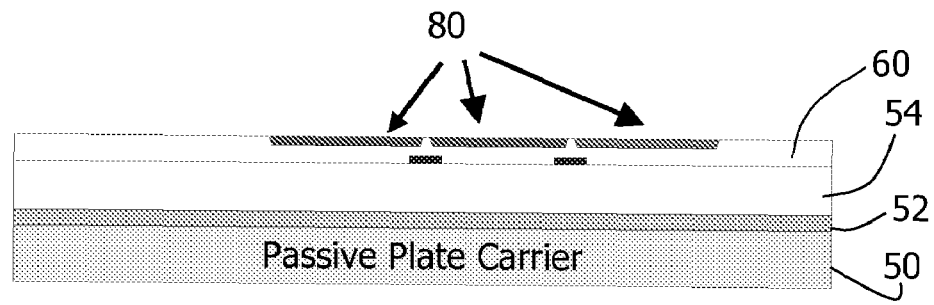
Figure 2H:
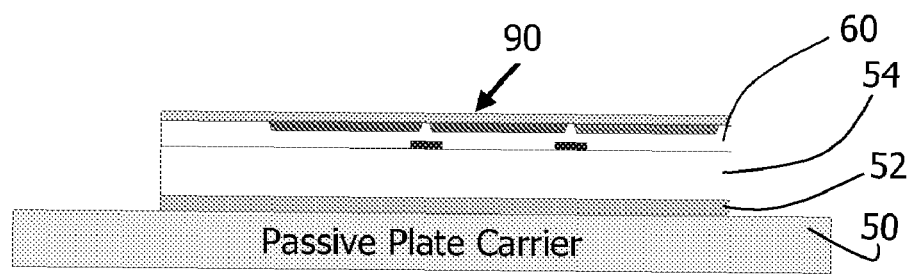
Figure 2I:
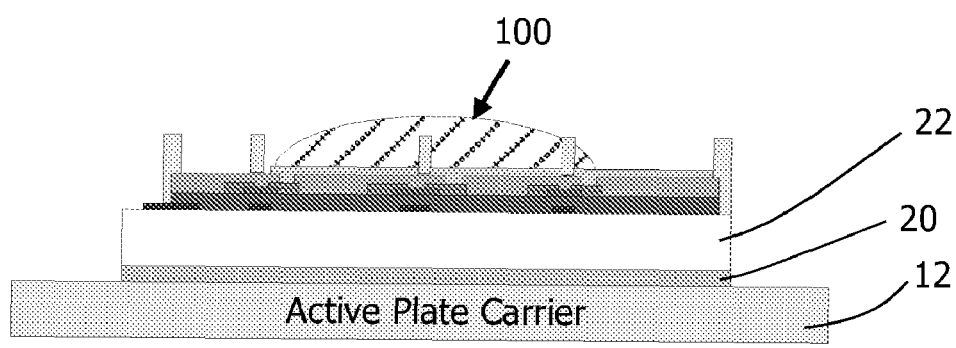
Figure 2J:
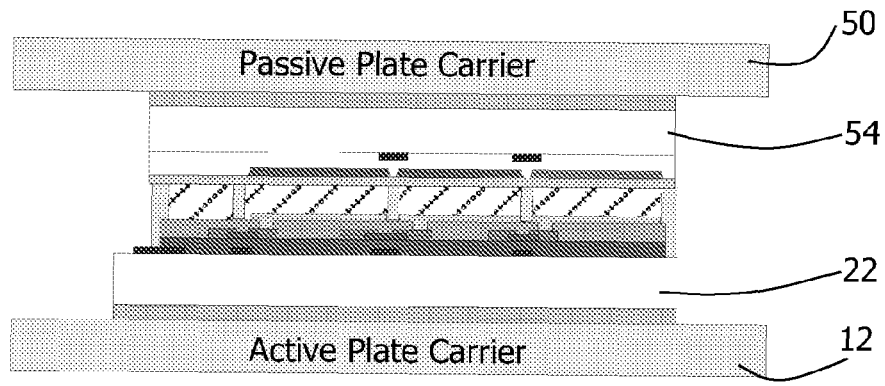
Figure 2K:
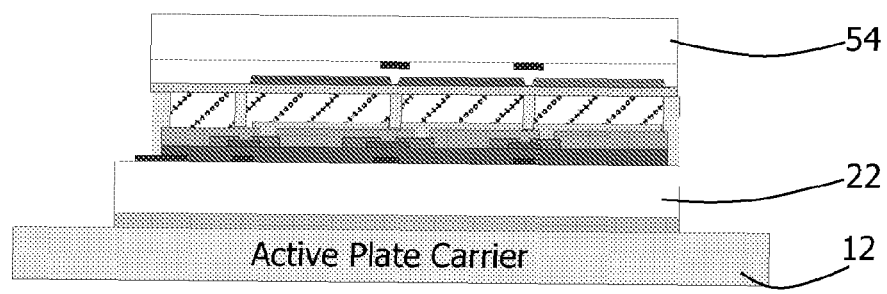
Figure 2L:
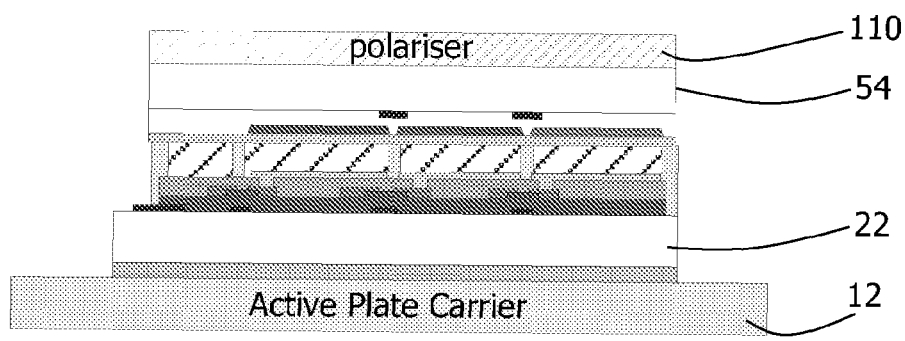
Figure 2M:
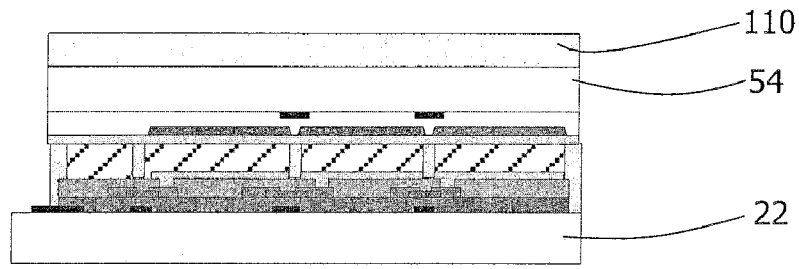
Figure 2N:
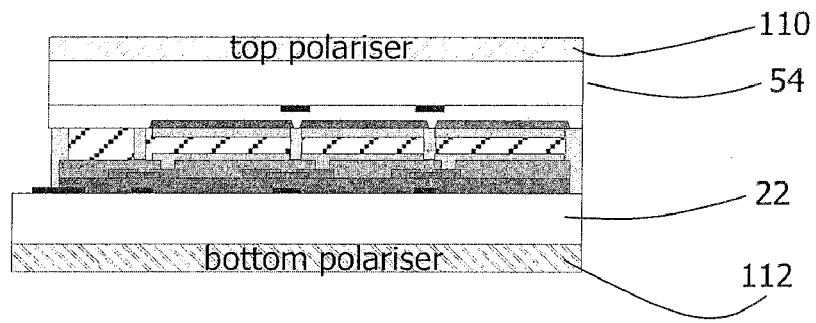

FIGS. 2A to 2N show schematic diagrams for sequential stages of one fabrication scheme. For clarity, these Figures show only one display being made, but in practice there would be many displays on large glass substrates, as shown in FIG. 1.

FIG. 2A shows a glass carrier plate 12 with an a-Si release layer 20 and a plastic layer 22 which functions as a plastic substrate. This substrate can form the basis of the active plate and the passive plate.

This plastic layer must be strong enough to be one of the walls of the completed cell. Suitable plastic layers could be colourless polyimides, polyethylene napthalate (PEN), polyethersulfone (PES), benzocyclobutene (BCB) or other plastic layers. The thickness of the plastic layer is a compromise between small thickness for low cost and ease of fabrication and thicker layers to give strength. It will normally lie within the range 5 to 50 µm. The release layer 20 may be a thin layer of a-Si, and is deposited onto the glass substrate 12 before the plastic layer 22 is added. This release layer 20 may not be needed, depending on the release process to be employed.

An a-Si release layer is applied by PECVD and can be from 10 to 50 nm thick.

In one example, the plastic layer is spin coated. This gives an extremely high quality surface and can give an extremely thin layer if required. Most importantly, the plastic is capable of wet casting. The plastic can thus instead be applied by spreading with a blade or printing techniques such as offset litho or silk screen printing.

In a further example, explained in further detail below, the plastic layer is parylene, and the parylene deposition process is used.

FIG. 2B shows the active plate, in which a-Si TFT arrays have been made on the plastic surface using (almost) standard processing. The maximum processing temperature will depend upon the plastic layer chosen, but it could be higher than for freestanding plastic films because the plastic is securely anchored to the rigid glass substrate 12 and there are no problems with shrinkage.

The TFT array comprises a gate metal layer 30, a silicon nitride gate dielectric layer 32 and ITO pixel electrodes 34. The TFTs are shows schematically as 36.

FIG. 2C shows the addition of column spacers 40 for the LC cell. These could either be made by inkjet printing or spinning on a suitable polymer layer and then patterning by photolithography. Dispersed glass or plastic beads or rods could also be used instead, but column spacers that stick to both substrates can give plastic cells increased mechanical strength and help protect the cell from separating.

FIG. 2D shows the fabrication of the passive plate substrate. The passive plate also comprises a glass substrate 50, and optional release layer 52 and a plastic substrate 54 (which may be the same plastic as used for the active plate or may be a different plastic). FIG. 2D also shows black mask layers 56. This demonstrates another advantage of fabricating plastic displays in this way, which is that structures can be built into the substrate. The black mask 56 could also be made at a later stage using standard methods.

As shown in FIG. 2E, a second polymer layer 60 is added to the passive plate layers. This step is only needed if a buried black mask layer is used.

As shown in FIG. 2F, recessed wells 70 are etched into the passive carrier plate. This step is only needed if colour filters are to be ink jet printed. These wells serve to define accurately the shape of the colour filter pixels. The wells can be etched into the plastic layer either by photolithography and oxygen plasma, laser ablation or by stamping with a hard mask.

FIG. 2G shows the passive carrier plate after ink jet printing of the colour filter layers 80.

FIG. 2H shows an ITO layer 90 sputtered onto the glass substrate. Furthermore, discrete display devices are formed over the common active plate glass substrate by etching away the ITO, plastic and a-Si release layer.

At this stage, different process routes may be taken, depending on whether traditional cell making is used, or the newer Vacuum Alignment with Liquid Crystal (VALC) method, sometimes called drop filling. In this drop filling method, LC droplets are put onto one of the plates before alignment and plate coupling is carried out under vacuum. By way of example, the following diagrams are for the VALC process.

FIG. 2I shows an LC drop 100 put on the active plate area of the plastic display.

The assembled panel of FIG. 2J is then formed by using the VALC process.

One of the glass plates is then removed from the plastic layer that it is stuck to. This can be done by laser irradiation or lamp heating through the glass of the release layer or bottom of the plastic layer, or by heating the glass plate on a hot plate.

FIG. 2K shows the glass substrate of the passive plate removed, for example by a laser release process. The passive glass carrier plate can then be cleaned to remove all traces of residues from the passive plate process before being re-used.

As shown in FIG. 2L, a polarizer 110 is then added. It is easier to do it at this stage before final release of the display because the display still has rigidity due to its coupling to the glass. The polarizer also gives added strength to the top plastic layer. A Chip-on-Glass process can also be done at this stage, or interconnect foils added. The advantage of doing this at this stage is that the plastic sheet is still firmly stuck to the glass, simplifying alignment and fixing.

As shown in FIG. 2M, the plastic substrate of the active plate is also released from the active plate glass substrate 12, which can also be cleaned and used again.

A polarizer film is also applied to the plastic substrate 22 of each active plate. The second polarizer 112 is shown in FIG. 2N, which shows the completed display.

The polarizer must be applied display by display in this case. If VALC is not used, then interconnects are made after formation of the completed cells shown in FIG. 2N.

There are at lease three ways that the plastic substrates can be released from the glass substrate. Methods that can be used are laser release from plastic that is directly in contact with the glass substrate, laser release using a silicon release layer between the glass and plastic, and lamp heating with a silicon release layer. These are each discussed below.

(i) Laser Release Directly from a Glass Substrate.

a method has been disclosed in which laser irradiation (XeCl) is used through quartz carriers to release polyimide layers to form metal-polyimide circuits. A thin layer, <1 µm, is photo-ablated leaving freestanding polyimide films with good mechanical integrity. A similar process has been used in MEMS fabrication, but this time the polyimide is used as a sacrificial layer, which is dissolved after the laser release process. In principle this is an ideal process for making plastic display because it does not require any additional release layers to be deposited or spun.

(ii) Laser Release Using an a-Si Release Layer.

Figure 3:
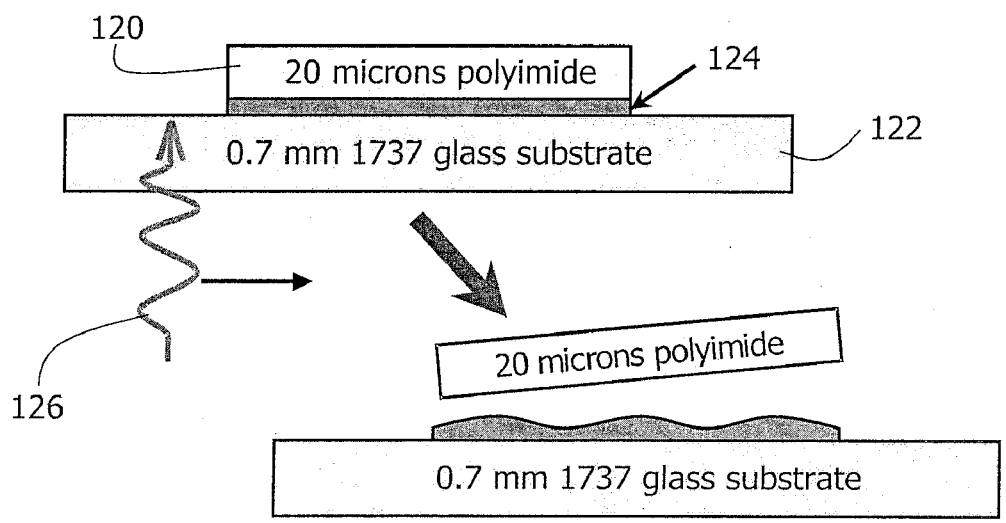
FIG. 3 shows a release process which can be used in the method is described with reference to FIGS. 2A to 2N for a polyimide plastic substrate.

The second method is to use the laser release process with an a-Si release layer, as used in the so-called SUFTLA process. FIG. 3 shows a 20 µm polyimide plastic substrate 120 attached to a glass carrier 122 using an a-Si release layer 124, which is made by Plasma Enhanced Chemical Vapour Deposition (PECVD).

The polyimide 120 is dry etched using a metal masking layer. The a-Si release layer 122 is also dry etched to leave a bare substrate around the polyimide island. Scanning a XeCl laser line beam 126 across the bottom of the glass causes the a-Si to melt and hydrogen to be released. The polyimide is then cleanly released from the surface of the glass.

(iii) Release Using an a-Si Release Layer and Lamp or Hotplate Heating

As an alternative to laser irradiation of an a-Si release layer the a-Si can be rapidly heated by lamps designed for Rapid Thermal Processing (RTP), or by lowering the samples onto a hotplate.

The laser release examples above refer to the use of a polyimide plastic substrate, and the use of polyimide as a plastic substrate for electronic devices has been proposed in the past. This is very strong and has good mechanical properties after release, but it has strong birefringence. This means that it is suitable as a substrate for reflective and emissive displays and sensors, but that it cannot be used in transmissive LCDs.

There is therefore a desire for an alternative plastic layer. Some of the plastics that have been used for display substrates can only be made by thermal extrusion, such as polyethylene napthalate (PEN), polyethersulfone (PES) and polyethylene terephthalate (PET). There is no simple way of applying these as thin films to glass substrates.

One preferred alternative plastic material for the substrate in accordance with an aspect of the invention is parylene, and a laser release process is appropriate for this plastic material.

Parylene is widely used as a coating layer for surgical tools (such as catheters), surgical implants (such as artificial hips and heart valves) and coatings for high specification circuit boards and aerospace components.

Parylene is deposited by a three-stage vacuum process in three different vacuum chambers, rather than being thermally extruded or applied as a liquid. The three deposition steps are:

(i) Sublimation of the solid dimer at approximately 150° C. in chamber A.

(ii) The dimer then passes through a vacuum furnace (chamber B) at about 680° C. where it is cracked by pyrolosis to form a stable monomer.

(iii) The monomer then passes into the deposition chamber C where it is simultaneously absorbed and polymerised on the substrate surface.

The substrate is at room temperature during deposition, so no stress is built into the layers during cooling, which is a feature of all elevated temperature deposition processes.

Other notable features of parylene are:

(i) It has near perfect conformal coating and, due to the low-pressure deposition process used, it can fill in small spaces. It is considered to be a completely pinhole free barrier coating.

(ii) It has good chemical resistance, is insoluble in common solvents and resists attack from exposure to acids and bases.

(iii) It is highly transparent. In particular, it has substantially the same transparency as 1737 glass over approximately the same spectral range.

(iv) It has a high dielectric strength (>5 MV/cm) and dielectric constant of 2.65.

(v) It has excellent barrier properties to gas and liquids. This is potentially extremely important for LC cells, where it is important that moisture and ionic contaminants do not pass into the LC material.

(vi) Parylene has good mechanical properties as a self-supporting membrane. This is demonstrated by its known use in micro electromechanical switches (MEMS), for instance as self-supporting structures and membranes for valves and loudspeakers.

Thermal endurance is one of the biggest issues for plastic substrates. Parylene is quoted as having 100000 Hrs endurance at 106° C. in air and greater than 100000 Hrs endurance at 200° C. in inert atmospheres. Parylene C is the most common form of parylene (the other forms being parylene D and parylene N) and is the preferred option for this application, and has a melting temperature of 280° C. The maximum processing temperature of parylene is therefore in the range of 220 to 260° C.

An example of the experimental use of parylene as the substrate material to demonstrate the release process explained above will now be explained.

An amorphous silicon release process was used, and for this purpose the 20 nm of hydrogenated a-Si:H was deposited onto glass substrates at 300° C. The a-Si:H used contains approximately 7 atomic % hydrogen.

A 10 μm coating of parylene C was then deposited.

Figure 4:
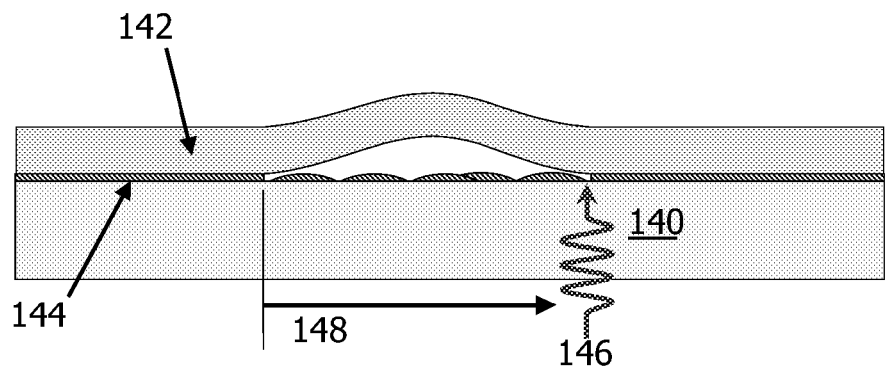
FIG. 4 shows a release process which can be used in the method described with reference to FIGS. 2A to 2N for a parylene plastic substrate.

A laser release process with a scanning XeCl excimer laser was employed, as shown in FIG. 4.

FIG. 4 shows the glass substrate 140, the parylene plastic substrate 142 and the release layer 144.

The laser, providing an XeCl laser beam 146 was directed through the back of the glass substrate 140, and the a-Si:H layer 144 very strongly absorbs the blue laser light at 308 nm. The fluence of the laser was adjusted so that it just melted the a-Si:H.

On melting, the a-Si:H balls up and releases hydrogen. The combination of a-Si:H melting and hydrogen release lifts the parylene away from the glass substrate.

In experiments performed, a pulsed laser was used, and the exposure area was moved along in steps (arrow 148) to implement the parylene lift-off process. The XeCl laser was pulsed and irradiated an area of approximately 20×0.5 mm with each flash. After each exposure, the laser was moved by 0.4 mm to give a series of overlapping lines.

However, any process that melts the a-Si:H by irradiation could be employed, including large area single pulses of laser and also strong lamp annealing.

These experiments demonstrated that the parylene layer can be easily removed from the plastic substrate, and has good mechanical properties so that it can be picked up and rolled.

Figure 5:
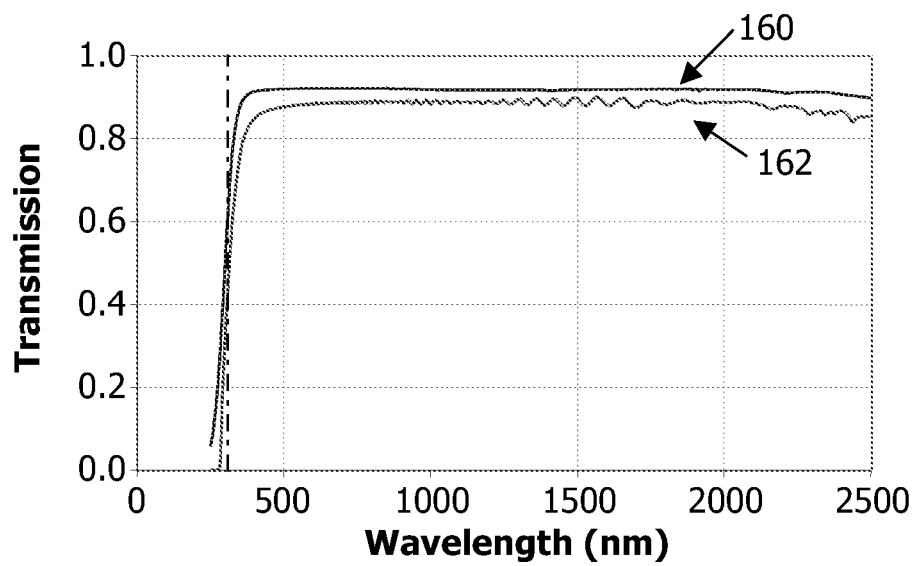
FIG. 5 is a graph to show the transmission performance of the plastic substrate used in the release process of FIG. 4.

The parylene had high optical transmission, and FIG. 5 shows the optical transmission versus wavelength for the 10 μm parylene film on a Corning 1737 glass substrate (plot 162). As shown in FIG. 5, the substrate coated with parylene has similar optical transmission characteristics to the Corning 1737 glass alone (plot 160), which is the standard glass used in the AMLCD industry.

The released parylene film was also placed between cross polarizers on a light box in order to determine the suitability for use in display applications using polarizers, and the performance was compared with a polyimide film. In this arrangement, the parylene absorbs substantially all light while significant amounts are transmitted through the polyimide. It is known that polyimide has high birefringence, which causes the polarized light to be rotated by different amounts and leads to the loss of light extinction. The high extinction of the parylene film demonstrates its suitability for use as a substrate material for LCDs.

Parylene is very lubricious, which could mean that it is difficult to get other thin films to adhere to it for making TFTs and displays. This can usually be solved for plastic substrates by exposing the surface to an Ar plasma before depositing the other layers. Other pre-treatment operations may be carried out, for example a multi-molecular layer of an organo-silane may be applied to function as an adhesion promoter.

The glass substrate may be cleaned before the parylene deposition process so that surface contaminants such as oils and ions are removed prior to the coating process. Conventional solvents can be used to perform the cleaning process.

The examples above relate to the manufacture of an active matrix display device. In further aspects, the invention relates more generally to the production of electronic devices comprising thin film circuitry on a plastic substrate. Thus, the invention also comprises applying a plastic coating to a rigid carrier substrate using a spin-on process or the parylene deposition process, forming thin film electronic elements over the plastic substrate and then releasing the rigid carrier substrate from the plastic substrate.

This process again enables substantially conventional substrate handling to be used in the processing of a thin film electronic device (for example having TFTs) on a plastic substrate. The use of a spin-on process or the parylene deposition process gives a flat, high quality surface.

The spin-on process enables very thin substrates to be formed. For example a polyimide substrate may be formed with thickness as low as 3 μm.

The same considerations described above relating to the different release mechanisms (i.e. possible additional release layers and different release methods) for releasing the plastic substrate from the underlying rigid carrier apply.

The examples of manufacturing method described in detail above are in connection with an LCD display. However, it will be apparent to those skilled in the art that there are many variations to each of the steps described.

More generally, the invention provides firstly the application of plastic to a substrate. The thickness of the plastic layers will normally be in the thickness range 2 to 50 μm. This plastic will ultimately become the plastic substrate of the display, for display applications. Suitable wet casting processes are spin coating, printing and spreading, and the parylene deposition process is an alternative suitable process.

The substrate can be either a standard glass substrate or a glass substrate coated with a blue-light absorbing layer. The choice depends on the plastic used and laser release properties.

A passivation layer will normally be desired, applied above the plastic layer. Suitable layer types are silicon nitride or silicon oxide deposited by Plasma Enhanced Chemical Vapour deposition (PECVD) or sputtering.

TFT arrays are then be made on the plastic/passivation layer. The TFT array fabrication can be carried out under fairly standard array processing conditions for a-Si or Low Temperature Poly-Si (LTPS). TFTs. There may have to be some small process changes to ensure that the deposited layers do not have high mechanical stress. The use of standard glass substrates coated with very thin layers of plastic and standard TFT array processing means that this process can be used in existing TFT-fabrication plants.

TFTs can be used as the active device element for multiplexing several different display types, not only the LCD example above. Whatever the display type is, the display is fabricated while the TFT array is still stuck onto the glass. This means that standard display fabrication tools and techniques can be used and the presence of a thin layer of plastic will not cause any significant differences. The display drivers can also be bonded to the display at this time.

The plastic layer is then removed from the glass substrate, in one example by shining a blue laser through the glass substrate to hit the bottom of the plastic (or the blue-light absorbing layer). The laser for this purpose will normally have to be scanned to cover the complete area of the display. Pulsed excimer lasers with wavelengths of 308 nm and 351 nm can successfully be used to remove yellow polyimide layers from glass, and by providing amorphous silicon underneath a plastic layer, polyimide, BCB, silicones and parylene can successfully be released from the glass.

Any yellow plastic, such as polyimide, can be directly laser released by absorption of UV laser light through the glass substrate. Generally yellow substrates can only be used with emissive or reflective displays, for instance reflective LCD, electrophoretic displays (E-Ink) or upward emitting emissive displays, such as OLED or AMPLED.

Clear plastics (such as BCB, silicones and parylene) that do not absorb UV laser light need an underlying absorption/release layer, such as the amorphous silicon layer mentioned above. However, suitable absorption or release layers include not only amorphous silicon, but also Cr or possibly yellow plastics, such as polyimide.

Clear plastics can be used with all display types, including transmissive and transflective LCDs and downward emitting OLEDS and PLEDs.

Release layers, such as a-Si, can also be used under yellow plastics to increase process window, reduce any damage to the plastic layer and make sure that there are no plastic residues on the glass. Hydrogen from the amorphous silicon also lifts the polymer layer away from the underlying substrate, which can make the release process more reliable.

As mentioned above, a liquid crystal display is only one example of display technology which can benefit from the invention.

Figure 6:
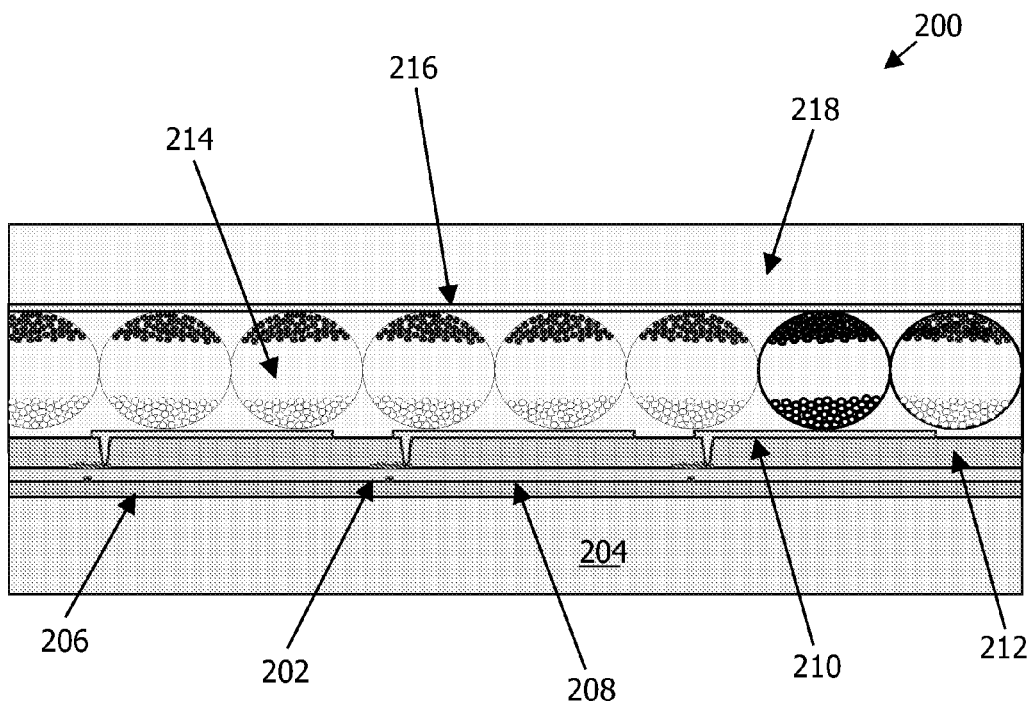
FIG. 6 shows a second example of manufactured display of the invention.

FIG. 6 shows an example reflective display device 200 using electrophoretic display material. An example of this type of display is known as an E-Ink display. An array of thin film transistors 202 is formed on a plastics layer 204 on glass. The TFT array is provided over a silicon nitride passivation layer 206 and a silicon nitride gate insulator layer 208, and the ITO pixels 210 are formed over a polymer passivation layer 212. The glass substrate is not shown in FIG. 3, which shows the final removed display device.

A layer of electrophoretic material comprises capsules 214 and is laminated onto the TFT array. The capsules are responsive to a local electric field across the ink foil layer. This layer is inherently tacky, and is placed on the TFT array and heated, to approximately 100 degrees Celsius, and rolled. The display modules are finished with a ITO layer 216 and a plastic protective layer 218.

Driver chips mounted onto foils are then connected to lead-in areas, and the laser release step is then carried out.

Figure 7:
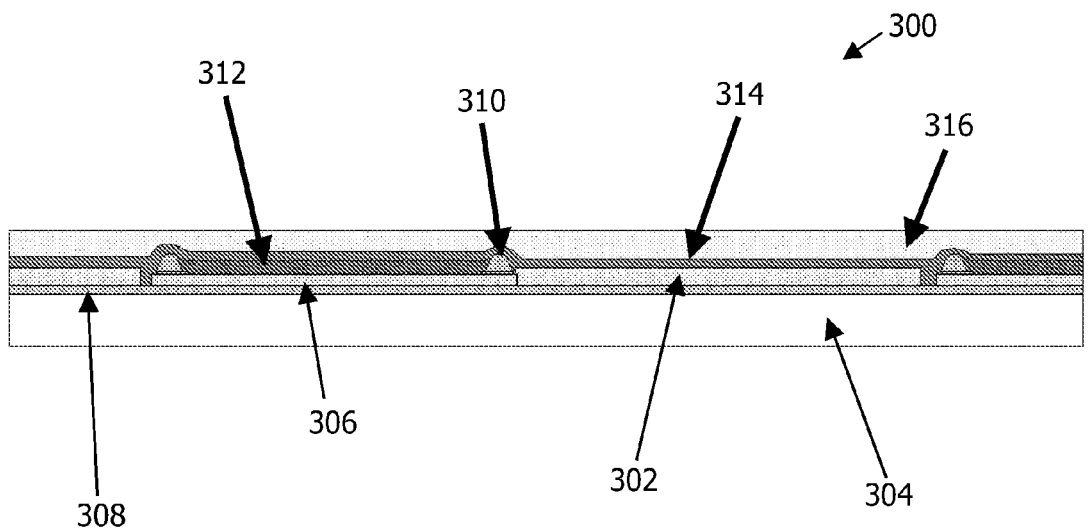
FIG. 7 shows a third example of manufactured display of the invention.

FIG. 7 shows an example polymer LED downwardly emitting display device 300. An array of encapsulated thin film transistor circuits 302 are formed on a clear plastic (such as silicone, BCB or parylene) substrate 304, and with transparent ITO pixel electrodes 306 formed over a silicon nitride passivation layer 308.

A hydrophilic polymer wall 310 surrounds the pixel (although this is not required for organic LEDs) which is defined by the polymer (or organic) LED material 312. A metal cathode 314, such as Ca, covers the structure, and is covered by a polymer passivation layer 316.

This example uses an amorphous silicon release layer over the glass substrate, each of which are not shown.

The examples of FIGS. 6 and 7 are manufactured in accordance with the invention, and it will be appreciated that numerous other specific display designs, as well as other electronic component designs, can be made using the approach explained above. For example, suitable display types include OLED (organic LED), PLED (polymer LED), EL (electroluminescent) and PDLC (polymer dispersed LC) displays, as well as LCDS.

Various other modifications will be apparent to those skilled in the art.

The invention claimed is:

1. A thin film electronic device, comprising:
   a parylene substrate;
   thin film electronic elements disposed over the parylene substrate; and
   an active matrix display, the thin film electronic elements defining active matrix pixel circuits, and the device further comprises a display layer over the active matrix pixel circuits.

2. A device as claimed in claim 1, wherein the display layer comprises a selectively reflective display layer.

3. A device as claimed in claim 2, wherein the selectively reflective display layer comprises electrophoretic material.

4. A device as claimed in claim 1, wherein the display layer over the array of pixel circuits comprises an LED layer.

5. A device as claimed in claim 1, further comprising a second substrate arrangement, and wherein the display layer comprises electro-optic material sandwiched between the first and second substrates.

6. A device as claimed in claim 5, wherein the electro-optic material comprises LC material.

* * * * *